United States Patent
Maurer et al.

(10) Patent No.: US 11,178,212 B2
(45) Date of Patent: Nov. 16, 2021

(54) COMPRESSING AND TRANSMITTING STRUCTURED INFORMATION

(71) Applicant: Facebook, Inc., Menlo Park, CA (US)

(72) Inventors: Benjamin Maurer, Palo Alto, CA (US); Noam Lerner, Mountain View, CA (US)

(73) Assignee: Facebook, Inc., Menlo Park, CA (US)

( * ) Notice: Subject to any disclaimer, the term of this patent is extended or adjusted under 35 U.S.C. 154(b) by 878 days.

(21) Appl. No.: 14/445,480

(22) Filed: Jul. 29, 2014

(65) Prior Publication Data

US 2016/0034499 A1 Feb. 4, 2016

(51) Int. Cl.
*G06F 16/25* (2019.01)
*H04L 29/08* (2006.01)
*H03M 7/30* (2006.01)

(52) U.S. Cl.
CPC ............ *H04L 67/10* (2013.01); *G06F 16/258* (2019.01); *H03M 7/3088* (2013.01); *H03M 7/707* (2013.01)

(58) Field of Classification Search
CPC ........................................................ G06F 8/30
See application file for complete search history.

(56) References Cited

U.S. PATENT DOCUMENTS

| | | | | |
|---|---|---|---|---|
| 9,853,956 | B2* | 12/2017 | Baum | G06F 9/4488 |
| 2005/0015514 | A1* | 1/2005 | Garakani | H03M 7/46 |
| | | | | 709/247 |
| 2014/0281885 | A1* | 9/2014 | Goupil | G06F 17/2247 |
| | | | | 715/234 |
| 2015/0317327 | A1* | 11/2015 | He | G06F 17/30327 |
| | | | | 707/693 |
| 2016/0154117 | A1* | 6/2016 | Baudia | G01S 19/34 |
| | | | | 342/357.31 |

OTHER PUBLICATIONS

Pusher, "The Pusher Protocol", Pusher, 2011.*
Nieuwpoort et al., "Ibis: an Efficient Java-based Grid Programming Environment", 2002.*

* cited by examiner

*Primary Examiner* — Dawaune A Conyers
(74) *Attorney, Agent, or Firm* — FisherBroyles, LLP

(57) ABSTRACT

Various of the present embodiments convert structured data to a channel-based representation facilitating pattern recognition by a compression utility. The channels may include a key channel, a number channel, a type channel, a length channel, etc. These channels reflect the same information as the structured data, but reorganized based upon the structured data's hierarchic structure. The encoder and decoder may include rule sets specifying the relations between the channels to deconstruct/construct the JSON file. Memoization, length encoding, and type encoding extensions may also be applied as part of the encoding/decoding process to further improve compression.

19 Claims, 9 Drawing Sheets

COMPRESSING AND TRANSMITTING STRUCTURED INFORMATION

BACKGROUND

Vast amounts of information are regularly transmitted between widely separated networked locations. Bandwidth limitations imposed across these networks may render it unfeasible to transmit the data in raw form. Accordingly, the information may be compressed prior to its transmission and decompressed following its reception. Compression methods, e.g., those employed by the popular compression program GZIP, identify recurring patterns in the information and simplify the representation of the information to avoid these recurrences. While able to reduce the size of the transmitted data, such compression methods do not always anticipate the character of data being compressed. For example, some utilities only identify repetitions within a "sliding window" of data values in the transmitted information. Some compression techniques compress data only within this window. However, the data may include many repetitions outside the window that could be compressed, but will not be because they fall outside the window. Similarly, some compression utilities only consider the information as a raw sequence of bits, without any regard to the original structure represented by the bit sequence.

BRIEF DESCRIPTION OF THE DRAWINGS

The techniques introduced here may be better understood by referring to the following Detailed Description in conjunction with the accompanying drawings, in which like reference numerals indicate identical or functionally similar elements.

Figure 1:
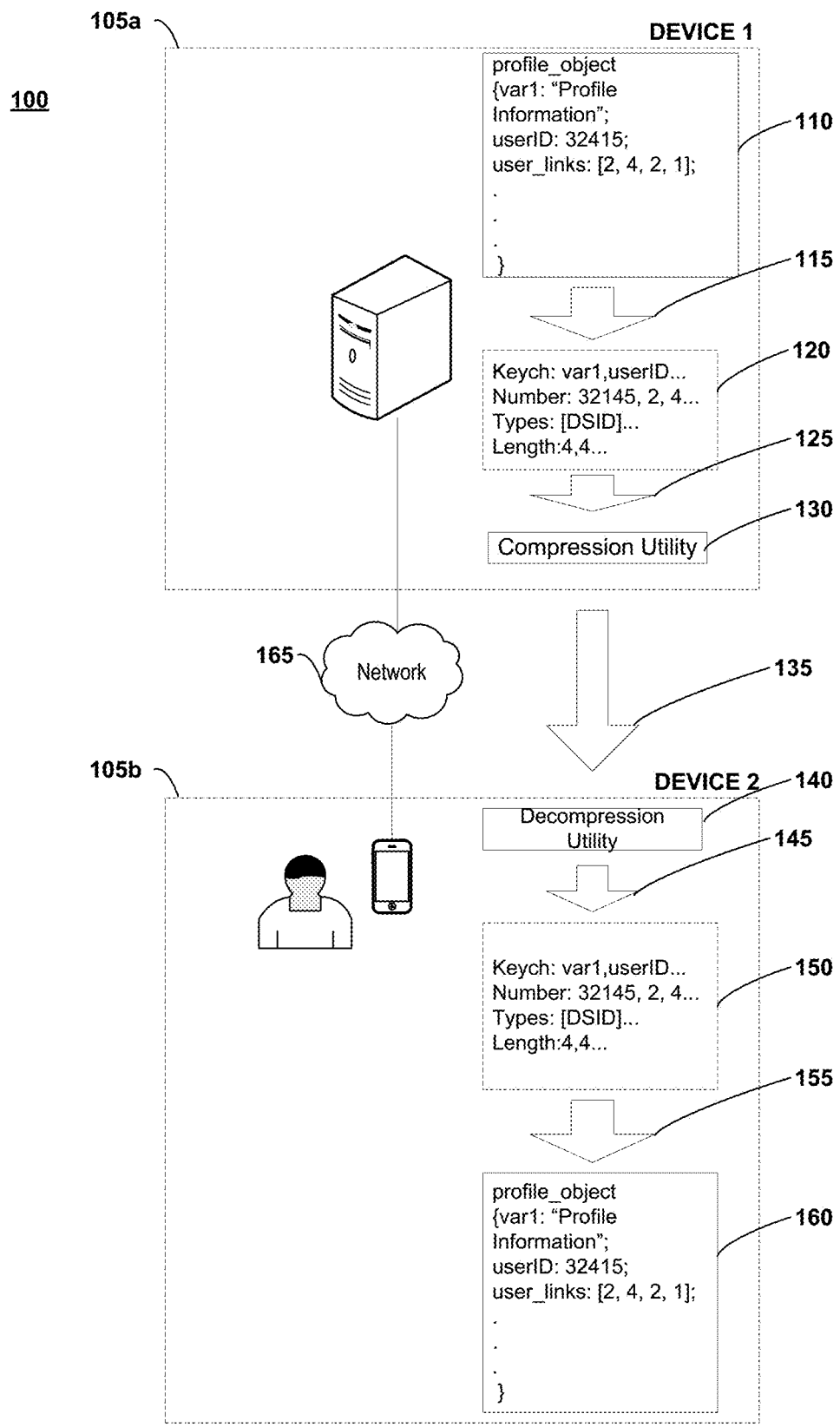
FIG. 1 is a block diagram illustrating channeling and compression operations as may occur in some embodiments.

While the flow and sequence diagrams presented herein show an organization designed to make them more comprehensible by a human reader, those skilled in the art will appreciate that actual data structures used to store this information may differ from what is shown, in that they, for example, may be organized in a different manner; may contain more or less information than shown; may be compressed and/or encrypted; etc.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Similarly, some components and/or operations may be separated into different blocks or combined into a single block for the purposes of discussion of some of the embodiments. Moreover, while the various embodiments are amenable to various modifications and alternative forms, specific embodiments have been shown by way of example in the drawings and are described in detail below. The intention, however, is not to limit the particular embodiments described. On the contrary, the embodiments are intended to cover all modifications, equivalents, and alternatives falling within the scope of the disclosed embodiments as defined by the appended claims.

DETAILED DESCRIPTION

GZIP and many other compression utilities identify patterns in linear sequences of bytes, ignoring any higher structure of data represented by those bytes. However, the byte sequences of some raw files, e.g., raw Javascript Object Notation (JSON) files, may not be in a form most conducive to this sequential compression. Though JSON is regularly referenced herein as an example for purposes of explanation, one will readily recognize variations in some embodiments applied to other structured data (e.g., XML, HTML, executable code such as x86 assembly, etc.). Reorganizing the JSON file based upon common data types occurring therein, e.g., in its key-value architecture, prior to compression may facilitate a more efficiently compressed file. For example, many characters appearing in the JSON representation ("]", "[", "}", "{", etc.) may be unnecessary when the data is encoded in binary form. Accordingly, some of the disclosed embodiments convert the JSON data to a channel-based representation facilitating pattern recognition by a compression utility. The channels may include, e.g., a key channel, a number channel, a type channel, a length channel, etc. (more than one number channel may be presented in some embodiments to facilitate different types of numbers, such as floats, integers, etc.). These channels may reflect the same information as the JSON data, but reorganized based upon the JSON data's hierarchical structure. The encoder and decoder may include rule sets specifying the relations between the channels and original JSON data to deconstruct/construct the JSON data. "Memoization", length encoding, and type encoding extensions may also be applied as part of the encoding/decoding process to further improve compression. Memoization, described in greater detail herein, involves the recognition of recurring patterns in the channeled data and their substitution with a reference, e.g., having a smaller memory footprint. Length encoding, described in greater detail herein, involves the variable adjustment of numerical representations to facilitate improved compression. Type coding extensions, described in greater detail herein, involve the creation of channel types to encapsulate recurring channel patterns and thereby reduce the memory footprint. The channels may be serialized in some embodiments prior to compression.

Various examples of the disclosed techniques will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the techniques can include many other obvious features not described in detail herein. Additionally, some well-known structures or functions may not be shown or described in detail below, so as to avoid unnecessarily obscuring the relevant description.

The terminology used below is to be interpreted in its broadest reasonable manner, even though it is being used in conjunction with a detailed description of certain specific examples of the embodiments. Indeed, certain terms may even be emphasized below; however, any terminology intended to be interpreted in any restricted manner will be overtly and specifically defined as such in this section.

Overview—Example Use Case

FIG. 1 is a block diagram illustrating channeling and compression operations as may occur in some embodiments. A first device 105a, e.g., a user device such as a mobile phone, a network server, a router, a repeater, etc. may include data in a JSON representation 110. The system may convert 115 the JSON representation 110 to a channeled form 120. The channeled form 120 reflects the hierarchical structure of the JSON representation 110 in a group of sequential channels, each channel reflecting information regarding the key-value pairings of the JSON representation 110. Though not depicted in FIG. 1, memoization of the channeled data 120 may incur inline with the channeled data's 120 generation or subsequent to the channeled data's 120 generation. Channeled data 120 may then be passed 125 to a compression utility 130 before being transmitted 130 in compressed form across one or more networks 165. Though this example depicts transmission across a network, one will recognize that the compressed data may be stored locally to reduce the memory footprint, transferred to a physical memory disk or other storage device, etc.

In this example, however, the compressed data may be received at a second device 105b. A decompression utility 140 may recover 145 the channeled data 150. Though not depicted, in some embodiments dememoization (the reversal of memoization, e.g., the substitution of the memoization reference by the channel values the reference represents) may also be performed following decompression to recover the channeled data 150. The channeled data 150 may then be dechanneled 155 (e.g., each the channels read and the corresponding JSON structure generated) and the original JSON data recovered 160.

Process Overview—Channeling and Compression

Figure 2:
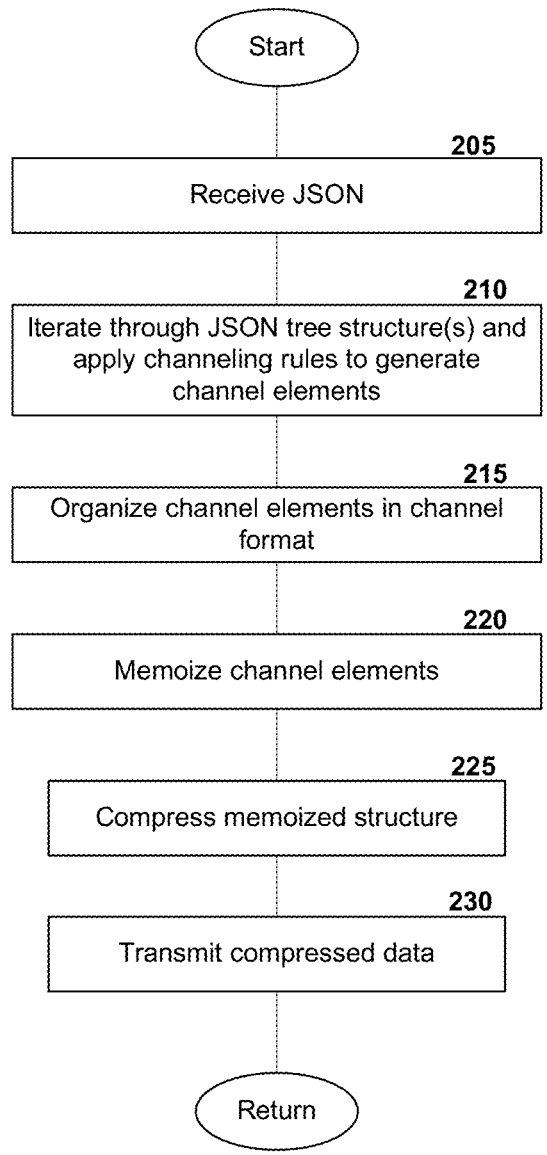
FIG. 2 is a flow diagram illustrating a process for channeling a JSON data structure as may be implemented in some embodiments.

FIG. 2 is a flow diagram illustrating a process for channeling a JSON data structure as may be implemented in some embodiments. At block 205, the system may receive structured data, e.g., one or more JSON objects. At block 210, the system may iterate through the JSON object tree structures and apply channeling rules to generate channel elements. At block 215, the system may organize the channel elements into a channel format. At block 220, the system may memoize the data as it appears in the channel formatted structure. In some embodiments, as discussed below, memoization may occur inline with channelization. For example, in some embodiments, blocks 210, 215, and 220 may occur simultaneously. The generation of the structures and memoization may occur while traversing the JSON structure. Memoization may recognize recurring patterns in each of the channels, and substitute a reference possessing a smaller footprint in its place. For example, where the integers channel includes the sequence 1, 3, 5, 2, 3, 5, 3, 5, 7, the recurrence of "3,5" may be replaced with a single character understood to reflect the "3,5" pairing. As another example, memoization may be applied to strings and string keys. For example, the sequence "abc", "def", "ghi", "abcd", "abc", "ab", "ghi", "abc" may transform to: "abc", "def", "ghi", "abcd", 0, "ab", 2, 0 (where 0 and 2 are the memoized indices). One will recognize that not all embodiments will memoize the channeled structure, or memoize the structure in this fashion (e.g., memoization may find patterns across channels whether than exclusively within a single channel). At block 225, the memoized structure may be compressed. At block 230, the system may transmit the compressed data. Though transmission is again presented in this example, as discussed above, the data may instead be stored locally, transferred to secondary storage, etc. Thus the compressed data may be generated wherever there exists a constraint upon the memory footprint.

Process Overview—Dechanneling and Decompression

Figure 3:
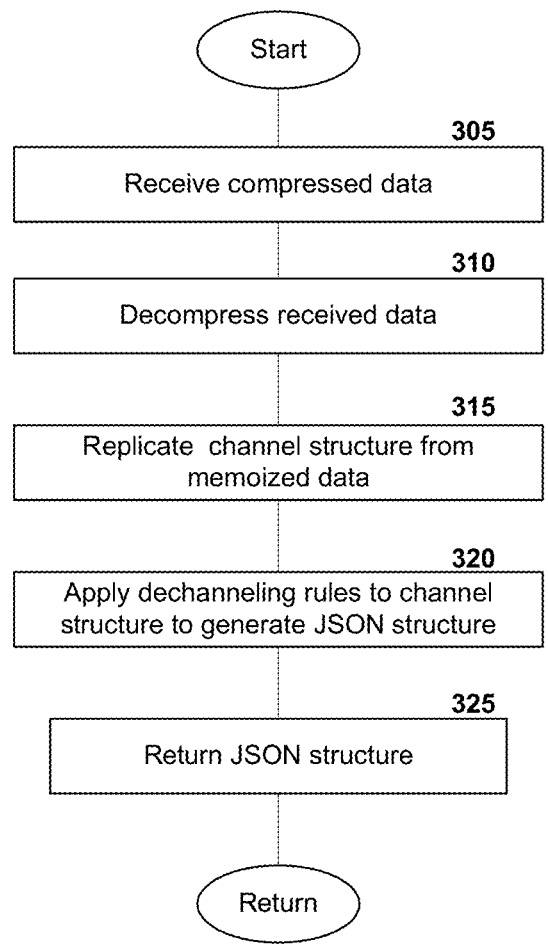
FIG. 3 is a flow diagram illustrating a process for dechanneling a JSON data structure as may be implemented in some embodiments.

FIG. 3 is a flow diagram illustrating a process for dechanneling a JSON data structure as may be implemented in some embodiments. At block 305, the system may receive compressed data, e.g., as generated in the process of FIG. 2. At block 310, the system may decompress the received compressed data. This may generate the memoized channeled data or just the channeled data if no memoization was applied.

Where the data was memoized, at block 315, the system may replicate the channel structure based upon the memoized data. In some systems, the encoding device may include a flag with the compressed data indicating whether memoization and/or channeling were or were not used. Consider the previous example wherein the "abc", "def", "ghi", "abcd", "abc", "ab", "ghi", "abc" was transformed via memoization to: "abc", "def", "ghi", "abcd", 0, "ab", 2, 0. After the algorithm encountered "abc" the memoization would be {0: "abc"}. After encountering "def"=>{0: "abc", 1: "def"}, after "ghi"=>{0: "abc", 1: "def", 2: "ghi"}, after "abcd"=>{0: "abc", 1: "def", 2: "ghi", 3: "abcd"}, etc. At block 315, when the system encounters a 0, the algorithm may now output "abc" to the JSON structure.

At block 320, the system may apply dechanneling rules to the channel structure to recreate the original JSON structure. At block 325, the system may provide the results to a program for use.

Channeling Example

Figure 4:
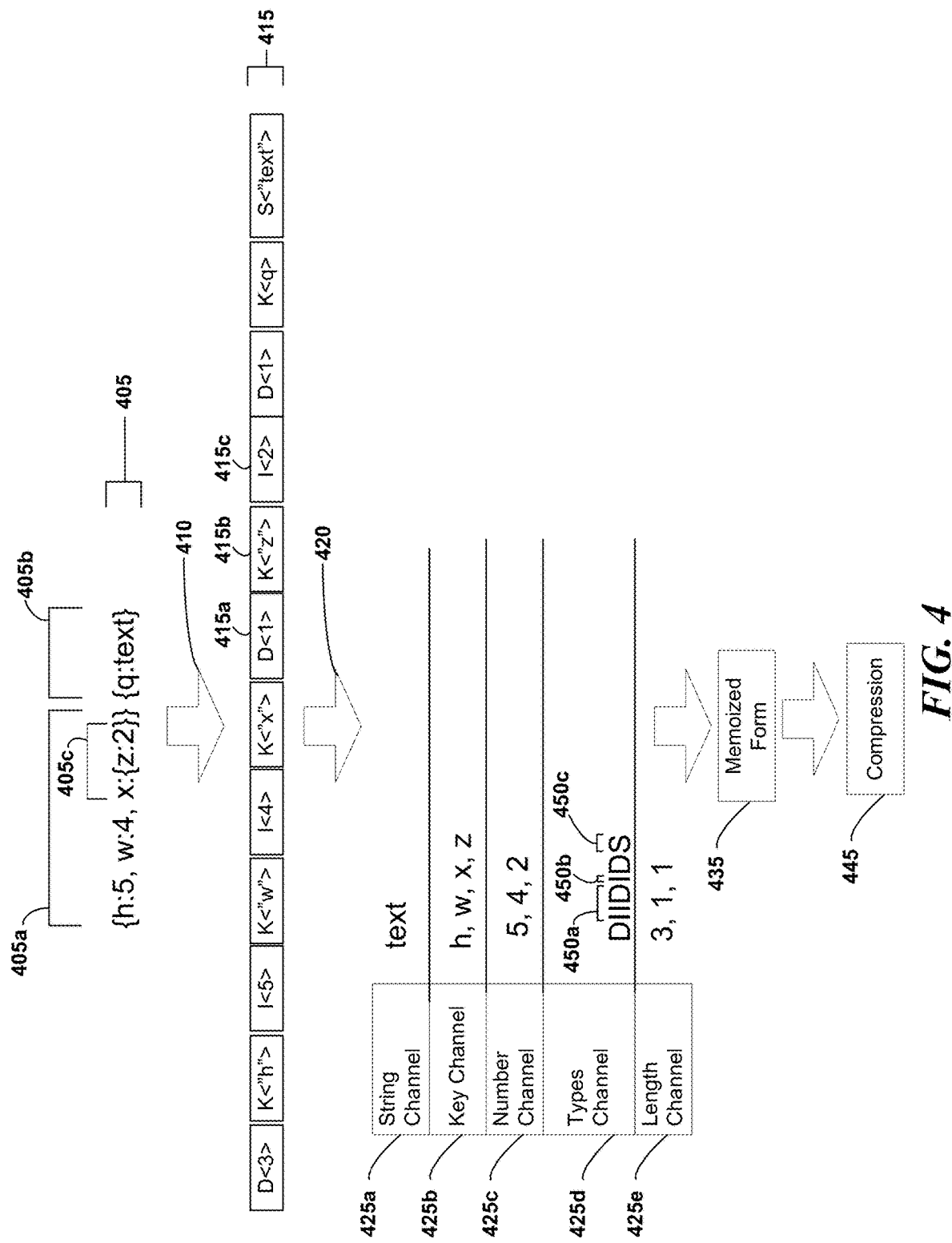
FIG. 4 is a block diagram illustrating the channeling of an example JSON data structure as may be implemented in some embodiments.

FIG. 4 is a block diagram illustrating the channeling of an example JSON data structure as may be implemented in some embodiments. An example JSON structure 405 includes two distinct objects, a first 405a and a second 405b. A third object 405c is nested within the first 405a. Each object may include a plurality of key-value pairs. For example, the structure 405 includes several keys, e.g.: "h", "w", and "x" (though as one familiar with JSON will recognize, any string may be used to represent the key, e.g. "profile_name"). The values may include, e.g., a number (e.g., an integer, floating value, a double value, etc.), string, or reference to another object. For example, here the key "x" references a new object 405c that contains the key-value pair "z:2". Objects may be other JSON structures or iterables, such as arrays.

The system may iterate through this tree-like structure to generate 410 the individual channel elements 415. For example, beginning at the topmost level (containing two separate objects 405a and 405b), the system may recognize that the object 405a contains three key value pairs ("D<3>"). The system may then iterate through these pairs, identifying the key "h", the integer value 5, the key "w", the integer value 4, etc. When reaching the nested element 405c, the system may recognize that the value associated with the key "x" is an object having a single key-value pair ("z:2"), generating the element 415a ("D<1>"). The system may iterate through this pair generating the channel elements 415b, 415c. At this point, the system will have completed the object 405a and will move on to the object 405b, which contains a single key value pair "q:'text'". After completing 405c and seeing no further elements in object 405a, the system will process object 405b. Thus, in some embodiments, the channeling process may proceed in a "depth" first approach, where the structured data is treated in a hierarchic fashion. Though not depicted here, in some embodiments the system may also generate length indications for each of the key and string elements. For example, the element "K<'h'>" may be preceded by a key length indication of 1, e.g., "KL<1>" (had the key been, e.g., the word "handle", then the length element may instead be "KL<6>"). Similarly, the string elements may be preceded by a length indication. For example, the string element S<"text"> may also be preceded by the string length indication "SL<4>". These lengths may be incorporated into separate key length and string length channels (not depicted).

Having generated a sequence of channel elements in this manner, the system may reorganize 420 the channel elements, inserting them into their respective channels in the order they appear in the sequence (note that this may occur inline with the identification of the channel elements in some embodiments). Initially, the type channel 425d may be populated to indicate the object and key occurrences. Each object is represented by a "D" in this channel in this example. Each D is associated with a corresponding length value from the length channel 425e. Accordingly, these example channel entries indicate that an object associated with the first D contains 3 key-value pairs represented by 405a. The first two of these pairs have integer values and are accordingly represented with an "I" in the types channel ("'h':5, 'w':4"). The next pair is the nested D 405c within 405a, which itself comprises a single key-value. Accordingly, the second digit ("1") in the length channel 425e is associated with the nested object 405c, indicating that the single next element 450b is the only key-value pair ("'z':2") in this nested object. The final object 405b is represented by a D, corresponding to the length of 1, and contains a string 450a value represented by the S element. The other channels 425a-c reflect the values associated with various of the keys identified in the types channel. For example, as each type channel element is considered in turn, when an integer key-value pair type channel element is encountered, the next unconsidered key channel 425b element will be associated with the next integer number channel 425c element (channels for floats, doubles, etc. may likewise be provided).

The channels may then be memoized 435 based upon recurrences therein and the memoized data then sent for compression 455. For example the recurrence of the "DI" entries in the types channel 425d may be substituted with a single memoized reference. Part of the memoization process 435 may also include reorganizing the channel entries to facilitate compression. For example, the compression tool may only compress recurrences within a "sliding window" of a fixed number of bytes. Anticipating this window, the memoization process may group memoized channel elements to increase the number of recurrences appearing in the window. Memoization may also proceed across channels (e.g., two identical objects may be represented by the same memoization reference).

Though in this example the object elements (e.g., 415a) are segregated from the lengths in their channel representations, as discussed in greater detail herein, in some embodiments certain channel types may be reserved to reflect the length information (e.g., the type "D3" may be used to indicate an object with 3 constituent components, and no corresponding length element need be created). In this manner, the content in other channels may be reduced.

In some embodiments, each channel of the channeled data may appear in succession in the data stream sent for compression. A header may be prepended, or otherwise included in the data stream, to indicate the byte offsets at which each channel begins. In this manner, the dechanneling system may locate each channel in the data stream.

Inline Memoization—Process

Figure 5:
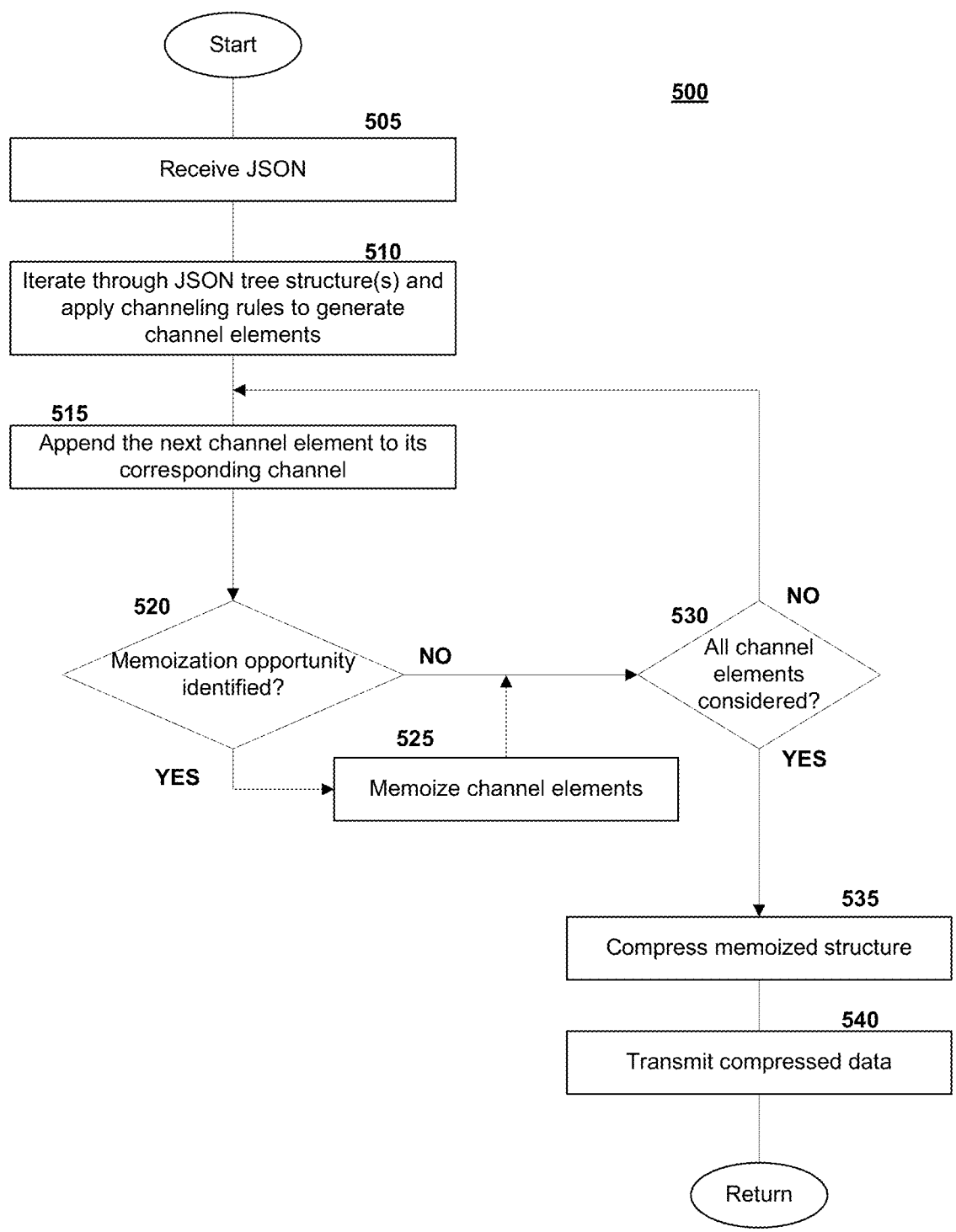
FIG. 5 is a flow diagram illustrating a process for performing inline memoization as may occur in some embodiments.

FIG. 5 is a flow diagram illustrating a process for performing inline memoization as may occur in some embodiments. At block 505, the system may receive structured data, e.g., JSON data. At block 510, the system may iterate through the JSON data and generate channel elements, e.g., the elements 415. In contrast to FIG. 2, however, as each channel element is considered at block 515, the system may consider at block 520 whether the element, alone or in sequence with its predecessors, presents an opportunity for memoization. For example, the element may reflect a new sequence or the completion of a previously recognized sequence susceptible to memoization. Where such an event occurs, the system may substitute or generate an appropriate reference at block 525. Once all the channel elements have been considered at block 530, the system may compress the memoized structure at block 535 and transmit (or store) the compressed data at block 540.

Though not depicted in the figure, one will recognize that in addition to appending the element at block 515, the system may adjust other channels, e.g., by adding a length indication where the element is a new object or iterable element.

Dechanneling Example

Figure 6:
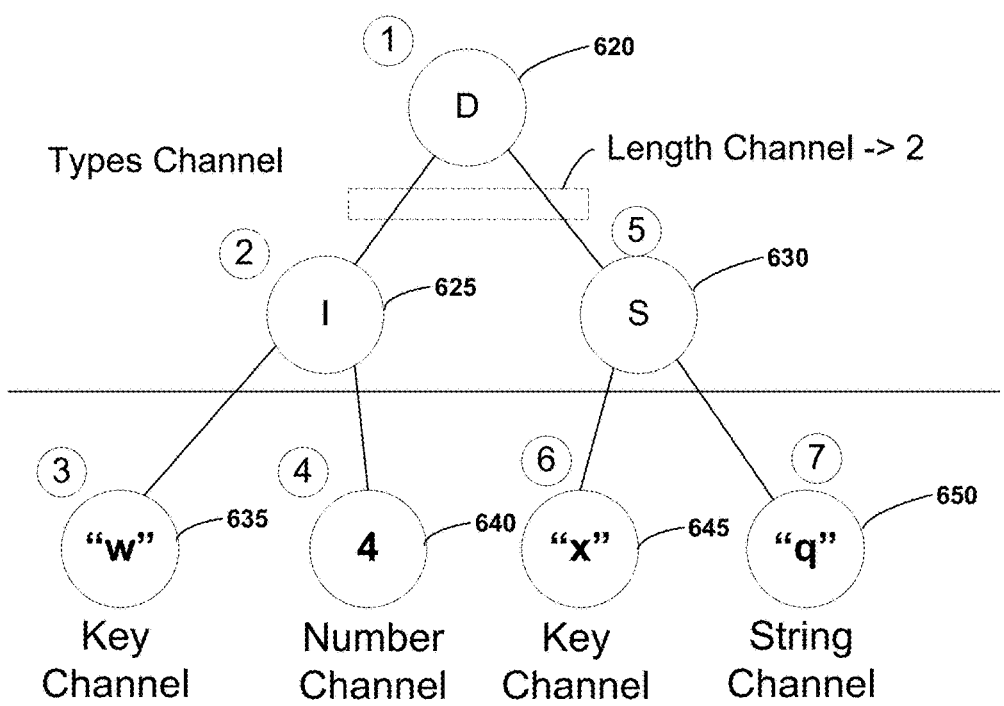
FIG. 6 is a block diagram illustrating the dechanneling of an example JSON data structure, e.g., following dememoization, as may be implemented in some embodiments.

FIG. 6 is a block diagram illustrating the dechanneling of an example JSON data structure, e.g., following dememoization, as may be implemented in some embodiments. As discussed above with respect to the example of FIG. 4, "rules" may indicate how channeled data is to be interpreted so as to replicate the original data structure. For example, the rules may direct the dechanneling system to consider the types channel, determine how many channel type elements relate to the current object form the length channel, and then reference the key, number, and string channels to create the non-object key-value pairs.

Thus, this example JSON 605 has a channel representation depicting a single object (D) with two key-value pairs (length 2), where the first pair is an integer number I, associated with the key channel element "w", and the second is a string S associated with the key channel element "x". To reconstruct this example JSON 605 from channel data 610, the system may first consider the "D" entry 620 in the types channel. The rules will direct the system to consider the length channel to determine the number of elements in the object (here, 2).

Thus, the system may generate a new JSON object which it anticipates will have two key-value pairs. The rules may indicate that the system consider the next N type channel elements where N was specified in the length channel (here, N=2, and so element 625 is considered first and then element 630 is considered). To dechannel the number element 625, the rules may indicate that the next key channel element 635 be considered and then the next number channel element 640. These may be paired and inserted into the JSON object as the key-value pair "'w':4". Similarly, the rules may indicate that for a string type channel entry 630, the system should first consult the next key channel entry 645 and then the next string channel entry element 650 to generate the key-value pair "'x':'q'". One will recognize that the rules may be adjusted to accommodate memoization structures and/or variations in the expected JSON or other structured data value types.

Dechanneling—Example Process

Figure 7:
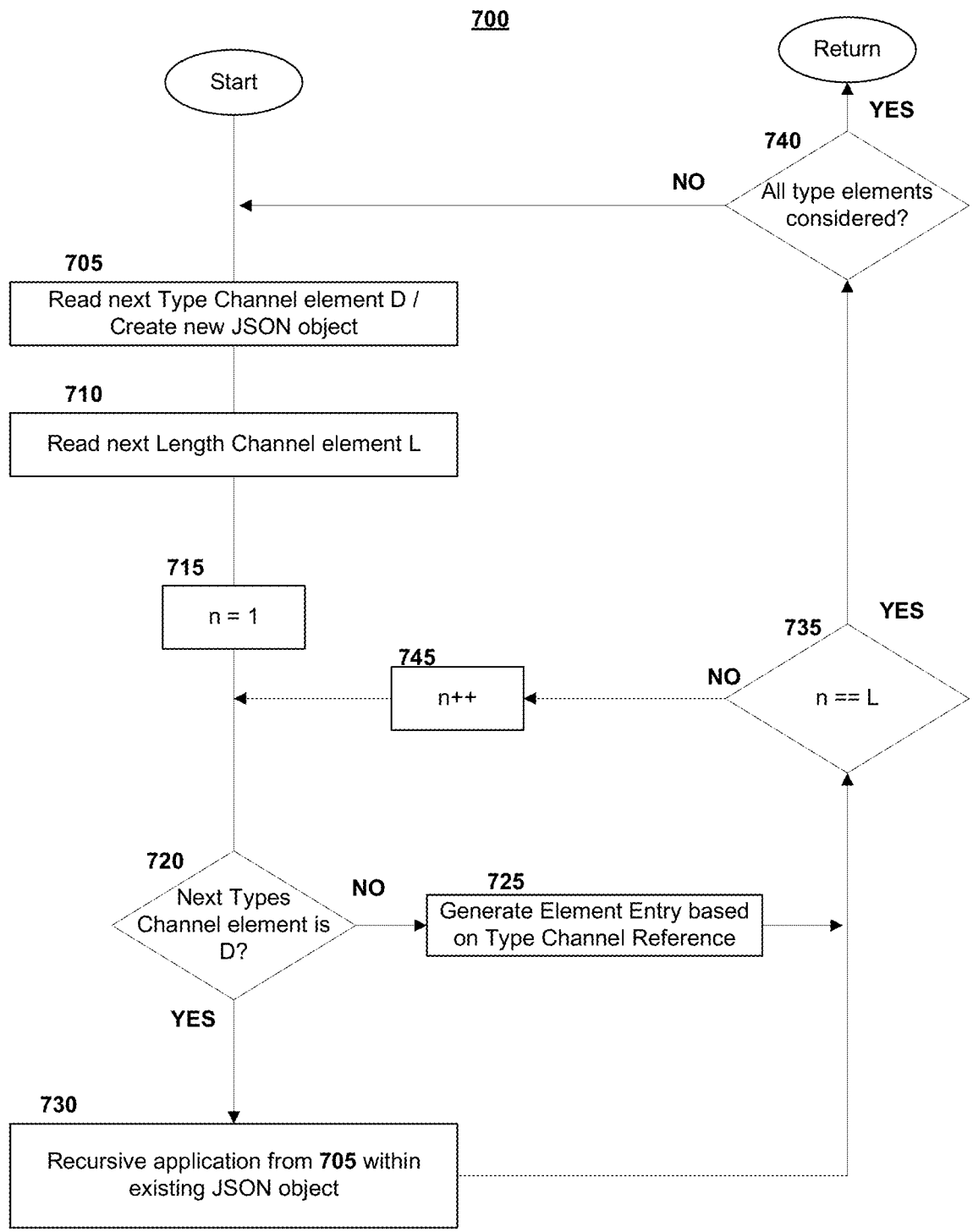
FIG. 7 is a flow diagram illustrating a process for dechanneling a channeled data structure as may occur in some embodiments.

FIG. 7 is a flow diagram illustrating a process 700 for dechanneling a channeled data structure as may occur in some embodiments. At block 705, the system may read the next type channel entry (which, initially will be a D channel element) and instantiate a new JSON object. Pursuant to the rules, the system may then consider the next length channel element, which will be associated with the D object channel type entry at block 710.

Though a counter may not be explicitly used in the implementation, to facilitate comprehension, at block 715 the system may initialize a counter n=1 to monitor the type channels considered in association with the last considered length channel element L.

At block 720, the system may consider whether the next Types Channel Element is a D (e.g., a nested object). If so, the system may recursively apply 730 the process 700 upon this element until a sub-JSON object tree structure has been created (it will then be inserted as a normal key-value pair). It will be understood that the next length channel element L will be considered in the sub-execution of the process 700. If the next type channel element is not an object, however, the system may generate a key-value pair specified based on the rules at block 725. As specified at blocks 735 and 745, the system may consider each of the successive type channel entries, applying the relevant rules for each, until all L type channels have been considered for the present object determined at 705.

Once all L type channel elements are considered, then at block 740 the system may determine if there are any type channel entries remaining. If there are type channel entries remaining, the next entry will be a new object which will be addressed at block 705. Otherwise, the system completes the dechanneling and returns the completed JSON (or other structured data) instantiation.

Variable Length Number Storage—Example

Figure 8:
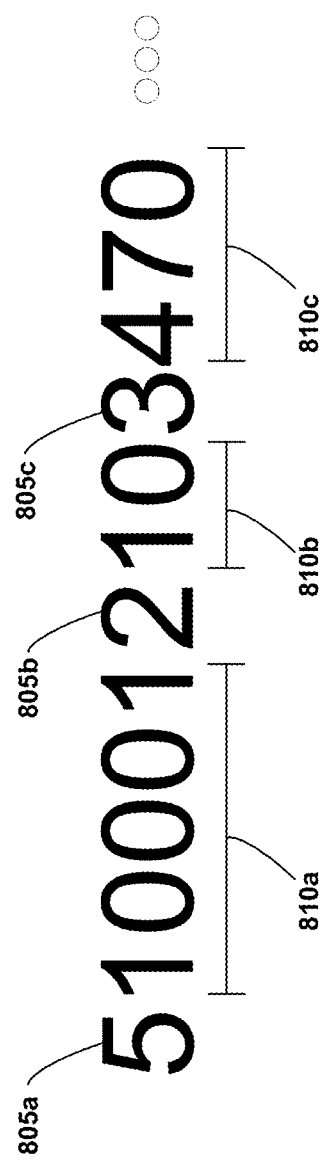
FIG. 8 is an example sequence illustrating a technique for adjusting a variable length integer as may occur in some embodiments.

FIG. 8 is an example sequence illustrating a technique for adjusting a variable length integer as may occur in some embodiments. To further facilitate the compression of various entries, in some embodiments, the system may provide for variable length integer designations so that unnecessary bytes are not included. For example, the system may specify that the leftmost byte in a number channel sequence indicates the number of subsequent bytes associated with the numerical value. Thus, rather than store all channeled integer values as 4 or 8 bytes, the system may specify varying sizes using less than the full capacity.

With reference to the example of FIG. 8, the digit 805a may indicate that the next five bytes 810a are associated with a single number (i.e., 0×10001). The next byte 805b indicates that the next two bytes are associated with a same number (0×10). Similarly, the next byte 805c indicates that the next three bytes are associated with a same number (0×470). This optimization may be performed following the user's submission of the JSON structure for compression (e.g., during channeling). The number and character of bytes used for the size representations may be based upon the memoization procedures applied in some embodiments.

Embodiment Variation—Length Encoding in Type Channel

In some embodiments, length encoding may be included in the type channel. For example, many iterable JSON structures (e.g., arrays, strings, maps) may require encoding of their length after encoding the type, for correct deserialization. Some embodiments may instead include a start and end marker. However the length is identified, for many applications most of the lengths are relatively short. In these situations, in some embodiments the system may encode the short iterables' length in the type channel, by using a type channel element designated for that purpose. Thus rather than one single type for an object (e.g., "D"), there may be multiple types reflecting each of the possible lengths. For example, if the largest encountered size was 15, then there may be a type of size 1 ("D1"), a type of size 2 ("D2"), etc. to the maximum of 15. By creating different type values for each length possibility, this frees the system from encoding the length for small iterables. When an iterable is longer than the maximum, e.g., 15, its length may again be encoded in the length channel in some embodiments. In some embodiments, the type is encoded in a single byte, permitting, e.g., 256 different types. Generally, there may be enough bits to encode the different types in a single 8 bit byte.

Some embodiments may also perform string sorting whereby strings in the string channel are sorted before encoding to result in more effective compression. The original location of each string may be encoded in a separate channel.

A static mapping of common keys to indices may also be included in some embodiments to allow a server and client to encode common object keys not as strings, but as their index, even in the first time they are being encountered (e.g., even when memoization has not yet been applied). This may be used in an application-specific context, e.g., where certain common values and repetitions are expected.

Computer System

Figure 9:
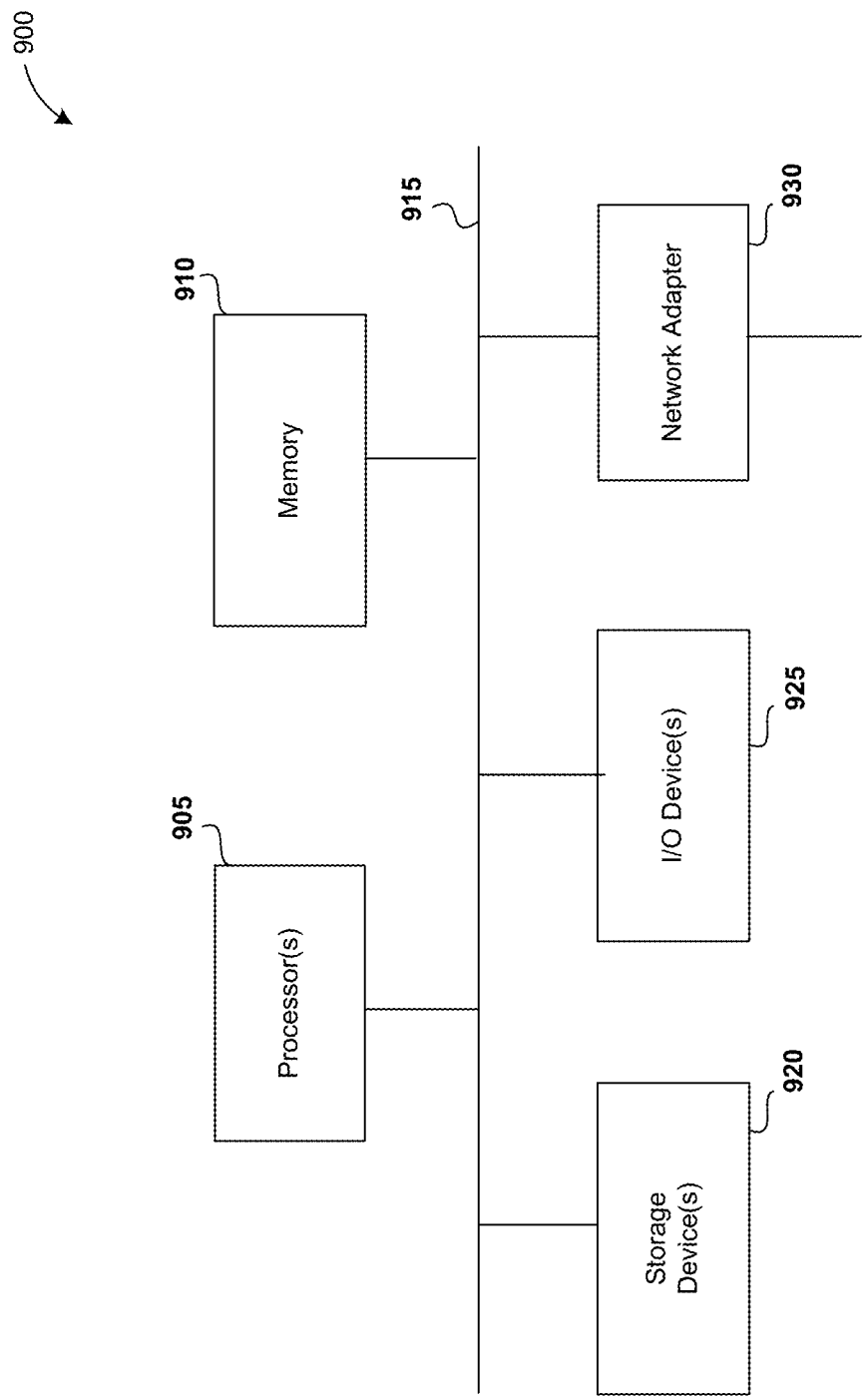
FIG. 9 is a block diagram of a computer system as may be used to implement features of some of the embodiments.

FIG. 9 is a block diagram of a computer system as may be used to implement features of some of the embodiments. The computing system 900 may include one or more central processing units ("processors") 905, memory 910, input/output devices 925 (e.g., keyboard and pointing devices, display devices), storage devices 920 (e.g., disk drives), and network adapters 930 (e.g., network interfaces) that are connected to an interconnect 915. The interconnect 915 is illustrated as an abstraction that represents any one or more separate physical buses, point to point connections, or both connected by appropriate bridges, adapters, or controllers. The interconnect 915, therefore, may include, for example, a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus, also called "Firewire".

The memory 910 and storage devices 920 are computer-readable storage media that may store instructions that implement at least portions of the various embodiments. In addition, the data structures and message structures may be stored or transmitted via a data transmission medium, e.g., a signal on a communications link. Various communications links may be used, e.g., the Internet, a local area network, a wide area network, or a point-to-point dial-up connection. Thus, computer readable media can include computer-readable storage media (e.g., "non transitory" media) and computer-readable transmission media.

The instructions stored in memory 910 can be implemented as software and/or firmware to program the processor(s) 905 to carry out actions described above. In some embodiments, such software or firmware may be initially provided to the processing system 900 by downloading it from a remote system through the computing system 900 (e.g., via network adapter 930).

The various embodiments introduced herein can be implemented by, for example, programmable circuitry (e.g., one or more microprocessors) programmed with software and/or firmware, or entirely in special-purpose hardwired (non-programmable) circuitry, or in a combination of such forms. Special-purpose hardwired circuitry may be in the form of, for example, one or more ASICs, PLDs, FPGAs, etc.

Remarks

The above description and drawings are illustrative and are not to be construed as limiting. Numerous specific details are described to provide a thorough understanding of the disclosure. However, in certain instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. One will recognize that "memory" is one form of a "storage" and that the terms may on occasion be used interchangeably.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any term discussed herein is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given above. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions will control.

What is claimed is:

1. A computer-implemented method for channeling structured data, comprising:
    receiving structured data comprising key-value pairs;
    generating a plurality of channel elements from the key-value pairs of the received structured data, wherein the generating includes:
        generating multiple type channel elements each of which indicates a type of a corresponding value in the key-value pairs,
        generating multiple key channel elements corresponding to keys of the key-value pairs, and
        generating multiple data channel elements corresponding to values of the keyvalue pairs;
    creating a channeled representation by assembling the channel elements into a plurality of channels, wherein the creating includes:
        generating a type channel and storing the multiple type channel elements in the type channel,
        generating a key channel and storing the multiple key channel elements in the key channel, and
        generating a data channel and storing the multiple data channel elements in the data channel;
    generating a compressed data object by compressing the channeled representation, wherein the generating includes:
        identifying a pattern in at least one of the assembled channel elements, and
        substituting a memoization reference for the pattern; and
    transmitting the compressed data object across a network, wherein creating the channeled representation improves an efficiency of compressing the structured data for transmission across network;
    wherein generating the plurality of channel elements further comprises generating length channel elements and number channel elements.

2. The computer-implemented method of claim 1, wherein the structured data comprises a JSON object.

3. The computer-implemented method of claim 1, wherein the plurality of channels reflects the same information as the structured data but reorganized based upon a hierarchic structure of the structured data.

4. The computer-implemented method of claim 1, wherein generating the plurality of channel elements comprises iterating in a depth-first search through the key-value pairs in the structured data and inserting each channel type element in its respective channel in the order in which it was encountered in the structured data.

5. The computer-implemented method of claim 1, wherein generating the length channel elements comprises identifying a number of keyvalue pairs associated with an object as a length channel element.

6. The computer-implemented method of claim 1, wherein generating the number channel elements comprises determining a number of bytes with which to represent a number and appending the number to the number channel elements.

7. The computer-implemented method of claim 1, wherein substituting the memoization reference for the pattern includes identifying recurrences of the pattern within a fixed number of bytes and substituting the recurrences with the memoization reference.

8. The computer-implemented method of claim 1, wherein substituting the memoization reference for the pattern includes identifying recurrences of the pattern across the channels and substituting the recurrences with the memoization reference.

9. A non-transitory computer-readable medium comprising instructions configured to cause one or more computer processors to perform a method comprising:
receiving structured data comprising key-value pairs;
generating a plurality of channel elements from the key-value pairs of the received structured data, wherein the generating includes:
generating multiple type channel elements each of which indicates a type of a corresponding value in the key-value pairs,
generating multiple key channel elements corresponding to keys of the key-value pairs, and
generating multiple data channel elements corresponding to values of the key-value pairs;
creating a channeled representation by assembling the channel elements into a plurality of channels, wherein the creating includes:
generating a type channel and storing the multiple type channel elements in the type channel,
generating a key channel and storing the multiple key channel elements in the key channel, and
generating a data channel and storing the multiple data channel elements in the data channel;
generating a compressed data object by compressing the channeled representation, wherein the generating includes:
identifying a pattern in at least one of the assembled channel elements, and
substituting a memoization reference for the pattern; and transmitting the compressed data object across a network, wherein creating the channeled representation improves an efficiency of compressing the structured data for transmission across the network;
wherein a generating the plurality of channel elements further comprises generating length channel elements and number channel elements.

10. The non-transitory computer-readable medium of claim 9, wherein the structured data comprises a JSON object.

11. The non-transitory computer-readable medium of claim 9, wherein the plurality of channels reflects the same information as the structured data but reorganized based upon a hierarchic structure of the structured data.

12. The non-transitory computer-readable medium of claim 9, wherein generating the plurality of channel elements comprises iterating in a depth-first search through the key-value pairs in the structured data and inserting each channel type element in its respective channel in the order in which it was encountered in the structured data.

13. The non-transitory computer-readable medium of claim 8, wherein generating the length channel elements comprises identifying a number of key-value pairs associated with an object as at a length channel element.

14. The non-transitory computer-readable medium of claim 9, wherein generating the number channel elements comprises determining a number of bytes with which to represent a number and appending the number to the number channel elements.

15. A computer-implemented method for dechanneling structured data, comprising:
receiving a channeled data representation of structured data that has been transmitted across a network, the structured data having multiple key-value pairs, the channeled data representation improving efficiency of compressing the structured data for transmission across the network, and the channeled data representation including:
a types channel that stores multiple types channel elements each of which indicates a type of a corresponding value in the key-value pairs,
a key channel that stores multiple key channel elements corresponding to keys of the key-value pairs, and
a data channel that stores multiple data channel elements corresponding to values of the key-value pairs; determining that a types channel element of the multiple types channel elements references a first object;
in response to determining that the types channel element references the first object, determining a next length element in a length channel, the length channel identifying a number of key-value pairs associated with an object in the structured data; and
generating a plurality of structured data key-value pairs, wherein the generating includes:
identifying a memoization reference in the channeled data representation substituted for a pattern in channel elements generated from the structured data, and
replacing the memoization reference with the pattern;
wherein receiving the channeled data representation further comprises receiving length channel elements and number channel elements.

16. The computer-implemented method of claim 15, wherein the types channel comprises at least one type element reflecting a length of an iterable object.

17. The computer-implemented method of claim 15, further comprising: considering the next N elements in the type channel, where N elements are indicated in the next length element in the length channel.

18. The computer-implemented method of claim 17, wherein one of the next N elements identifies a second object element, and in response to determining that one of the next N elements identifies the second object element, determining a next length element in the length channel.

19. The computer-implemented method of claim 15, wherein the channeled data representation further comprises an integers channel, the integers channel reflecting a variable length of integers.

* * * * *

UNITED STATES PATENT AND TRADEMARK OFFICE
CERTIFICATE OF CORRECTION

PATENT NO. : 11,178,212 B2
APPLICATION NO. : 14/445480
DATED : November 16, 2021
INVENTOR(S) : Benjamin Maurer et al.

It is certified that error appears in the above-identified patent and that said Letters Patent is hereby corrected as shown below:

In the Claims

In Column 10, Line 18, Claim 1, delete "keyvalue" and insert -- key-value --, therefor.

In Column 10, Line 56, Claim 5, delete "keyvalue" and insert -- key-value --, therefor.

In Column 11, Line 40 (approx.), Claim 9, after "wherein" delete "a".

In Column 12, Line 2, Claim 13, after "as" delete "at".

Signed and Sealed this
Twenty-ninth Day of August, 2023

*Katherine Kelly Vidal*

Katherine Kelly Vidal
*Director of the United States Patent and Trademark Office*